United States Patent
Wu et al.

(10) Patent No.: US 7,911,022 B2
(45) Date of Patent: Mar. 22, 2011

(54) ISOLATION STRUCTURE IN FIELD DEVICE

(75) Inventors: You-Kuo Wu, Sijhih (TW); An-Min Chiang, Hsinchu (TW); Shun-Liang Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 378 days.

(21) Appl. No.: 11/331,442

(22) Filed: Jan. 12, 2006

(65) Prior Publication Data

US 2006/0157816 A1 Jul. 20, 2006

Related U.S. Application Data

(60) Provisional application No. 60/643,210, filed on Jan. 12, 2005.

(51) Int. Cl.
*H01L 21/70* (2006.01)

(52) U.S. Cl. .... 257/508; 257/510; 257/519; 257/E29.02

(58) Field of Classification Search .......... 257/509, 257/519, 508, 510, 511, 517, 314, 506, E29.02; 438/298
See application file for complete search history.

(56) References Cited

U.S. PATENT DOCUMENTS

| | | | | |
|---|---|---|---|---|
| 3,845,495 A * | 10/1974 | Cauge et al. | ................. | 257/336 |
| 4,038,110 A * | 7/1977 | Feng | ............................. | 438/552 |
| 4,446,476 A * | 5/1984 | Isaac et al. | .................... | 257/770 |
| 5,043,778 A * | 8/1991 | Teng et al. | .................... | 257/374 |
| 5,262,672 A * | 11/1993 | Iranmanesh | .................. | 257/648 |
| 5,397,715 A * | 3/1995 | Miller | ........................ | 438/268 |
| 5,872,378 A * | 2/1999 | Rose et al. | .................... | 257/355 |
| 6,507,080 B2 * | 1/2003 | Jang et al. | ..................... | 257/409 |
| 2004/0067619 A1 * | 4/2004 | Niimi et al. | .................. | 438/275 |
| 2005/0045946 A1 * | 3/2005 | Kobayashi | .................... | 257/335 |
| 2005/0073006 A1 * | 4/2005 | Pequignot et al. | ............ | 257/355 |

OTHER PUBLICATIONS

Dictionary.com definition of "GATE", see p. 2.*

* cited by examiner

*Primary Examiner* — Lex Malsawma
*Assistant Examiner* — Robert Huber
(74) *Attorney, Agent, or Firm* — Thomas|Kayden

(57) ABSTRACT

A semiconductor device. The semiconductor device comprises an isolation structure and two heavily doped regions of a second conductivity type spaced apart from each other by the isolation structure. The isolation structure comprises an isolation region in a semiconductor substrate and a heavily doped region of the first conductivity type. The isolation region has an opening and the heavily doped region of the first conductivity type is substantially surrounded by the opening of the isolation region.

14 Claims, 6 Drawing Sheets

ISOLATION STRUCTURE IN FIELD DEVICE

CROSS-REFERENCE TO RELATED APPLICATIONS

The present application claims the benefit of U.S. provisional application Ser. No. 60/643,210, filed Jan. 12, 2005, entitled "Using NP Active Area And PP Active Area To Prevent High Voltage Metal Field Device Turning-On."

BACKGROUND OF THE INVENTION

1. Field of the Invention

The invention relates to field devices and, in particular, to field devices with channel stop regions.

2. Description of the Related Art

High voltage (HV) technology is often used for applications with operating voltages higher than logic or mixed-mode technology. Generally, high voltage technologies are developed based on low voltage technologies. Thus, high voltage devices and low voltage devices are integrated in high voltage technologies. Most local oxidation of silicon (LOCOS) and shallow trench isolation (STI) are developed for isolation between low voltage devices. Accordingly, threshold voltages of the field devices are typically twice higher than operating voltages of low voltage devices such that the field devices are not turned on when the low voltage devices are. In a 1.0 μm logic technology, thickness of the field oxide is typically 6000 Å and threshold voltage of the field device is typically 50V. Moreover, in more advanced technologies, such as 0.35 μm technology, the threshold voltage of the field device is lower because of thinner oxide (about 3500 Å) of the LOCOS or STI structure.

FIG. 1 is a cross section of a conventional metal field device in high voltage technology. The field device comprises a P-well 101, two N-wells 103, a field oxide 105, two N-type doped regions 107, an interlevel dielectric 109, and a metal layer 111. The P-well 101 is separated by the N-wells 103. The field oxide overlays the P-well 101 and the N-wells 103. The N-type doped regions 107 are respectively disposed, in the N-wells 103, on either side of the field oxide 105. The interlevel dielectric 109 overlays the field oxide 105. The metal layer 111 is disposed on the interlevel dielectric 109. In many applications, such as LCD drivers, the high voltages exceed 40V. In other words, a voltage higher than 40V may be applied to the metal layer 111. When the voltage source or process is not optimized, a current path is formed, under the field oxide 105, between the N-type doped regions 107 when a high voltage is applied to the metal layer 111. Thus, the metal field device is erroneously turned on, resulting in malfunction of an integrated circuit.

BRIEF SUMMARY OF THE INVENTION

An embodiment of a semiconductor device comprises an isolation structure and two heavily doped regions of a second conductivity type spaced apart from each other by the isolation structure. The isolation structure comprises an isolation region in a semiconductor substrate and a heavily doped region of the first conductivity type. The isolation region has an opening and the heavily doped region of the first conductivity type is substantially surrounded by the opening of the isolation region.

Another embodiment of a semiconductor device comprises an isolation region in a semiconductor substrate, two heavily doped regions of a first conductivity type, and a heavily doped region of the second conductivity type. The isolation region has an opening. The heavily doped regions of a first conductivity type are spaced apart from each other by the isolation region. The heavily doped region of the second conductivity type substantially surrounded by the opening of the isolation region.

Yet another embodiment of a semiconductor device comprises two diffusion regions having a first conductivity type, an isolation region, and a heavily doped region having the second conductivity type. The diffusion regions of the first conductivity type are spaced apart from each other by a diffusion region of a second conductivity type in a semiconductor substrate. The isolation region is disposed over the diffusion regions, wherein the isolation region has an opening over the diffusion region having the second conductivity type. The heavily doped region of the second conductivity type is disposed in a surface portion of the diffusion region having the second conductivity type and substantially surrounded by the opening of the isolation region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. Both wells and doped regions can be defined as diffusion regions.

Figure 1:
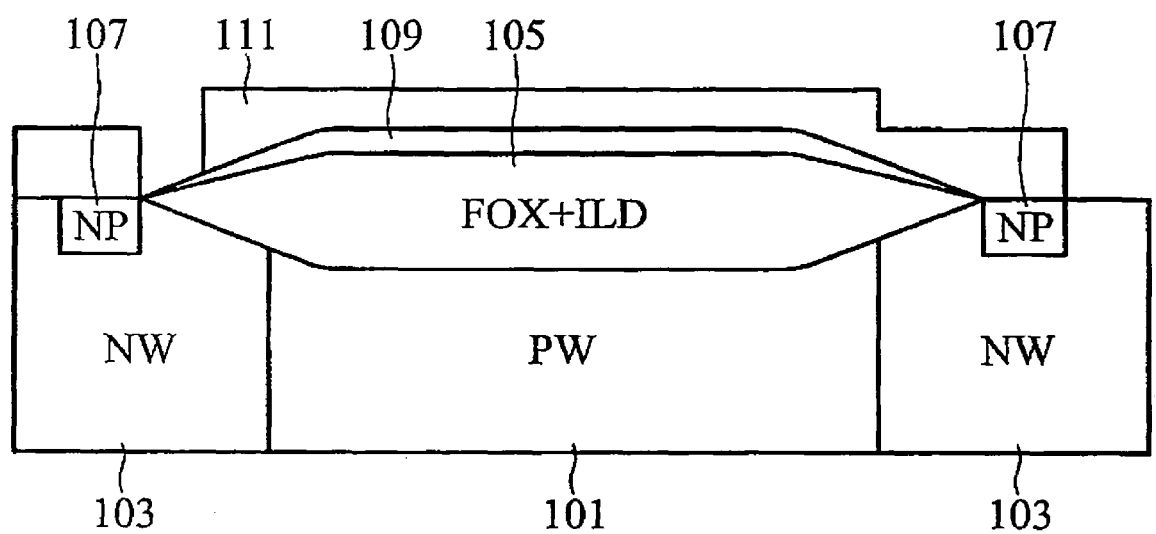
FIG. 1 is a cross section of a conventional metal field device in high voltage technology.
Figure 2A:
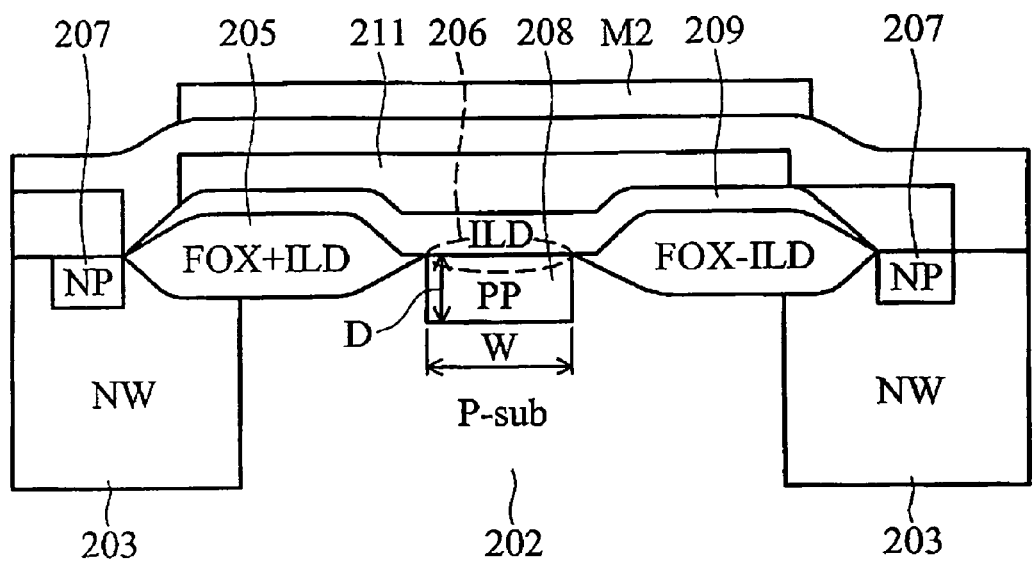
FIG. 2A is a cross section of an N-type metal field device in high voltage technology according to an embodiment of the invention.
Figure 2B:
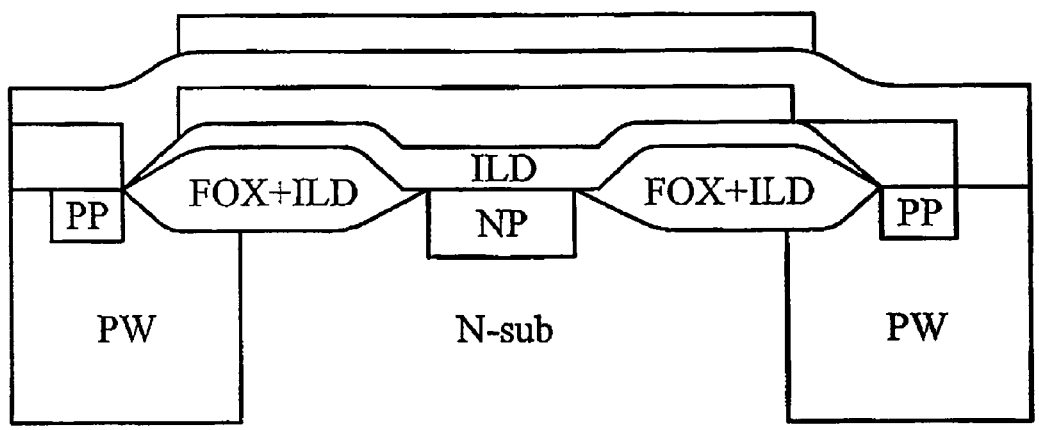
FIG. 2B is a cross section of a P-type metal field device in high voltage technology according to an embodiment of the invention.
Figure 2C:
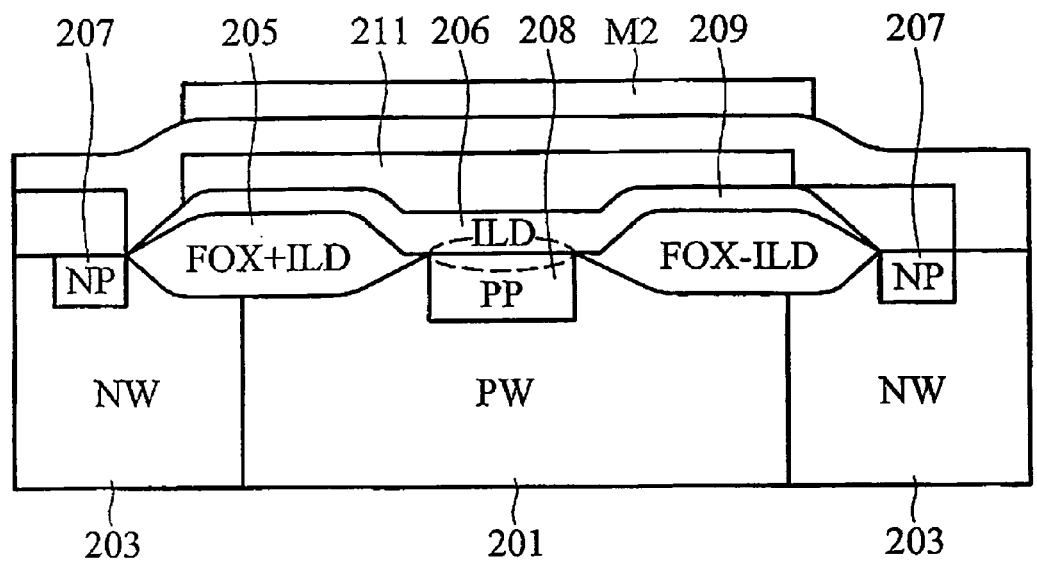
FIG. 2C is a cross section of an N-type metal field device in high voltage technology according to an embodiment of the invention.

FIGS. 2A and 2C are cross sections of an isolation structure of an N-type metal field device in high voltage technology according to an embodiment of the invention. The metal field device comprises two N-wells 203 having a surface doping concentration about $5*10^{11}$ to about $5*10^{12}$ atoms/cm$^2$, an isolation region 205, two N-type heavily doped regions 207 having a surface doping concentration about $5*10^{14}$ to about $5*10^{15}$ atoms/cm$^2$, a P-type heavily doped region 208 having a surface doping concentration about $5*10^{14}$ to about $5*10^{15}$ atoms/cm$^2$, an interlevel dielectric (ILD) or first dielectric layer 209, and a metal layer 211. The N-wells 203 are separated from each other by a P-type substrate 202, as shown in FIG. 2A or a P-well 201 having a surface doping concentration about $5*10^{11}$ to about $5*10^{12}$ atoms/cm$^2$ in a semiconductor substrate, as shown in FIG. 2C. The semiconductor substrate can be silicon, silicon-on insulator (SOI), and silicon-germanium (SiGe). The silicon thickness over insulator of SOI is larger than about 2 µm. The isolation region 205 has an opening 206 over the P-well 201 and overlays the wells 201 and 203. The N-type heavily doped regions 207 are respectively disposed in the N-wells 203. The P-type heavily doped region 208 is disposed under and substantially surrounded by the opening 206 of the isolation region 205 and acts as a channel stop region. Junction depth D of the P-type heavily doped region 208 is larger than about 0.2 µm. Width W of the P-type heavily doped region 208 is larger than about 0.5 µm. The interlevel dielectric (ILD) 209 overlays the isolation region 205 and the P-type heavily doped region 208. The metal layer 211 is disposed on the interlevel dielectric (ILD) 209. More specifically, the isolation region 205 is a local oxidation of silicon (LOCOS), shallow trench isolation (STI), and deep trench isolation (DTI) structure. Since there is a P-type channel stop region in the N-type metal field device, it is difficult to form a channel between the N-type heavily doped regions even when high voltage is applied to the metal layer 211. Thus, the N-type metal field device has a high threshold voltage and is difficult to turn on. Though an N-type metal field device is used as an example of the embodiment, the scope of the invention is not limited thereto. The invention also applies to a P-type metal field device with doping types thereof opposite to the N-type metal field device, as shown in FIGS. 2B and 2D.

Figure 2D:
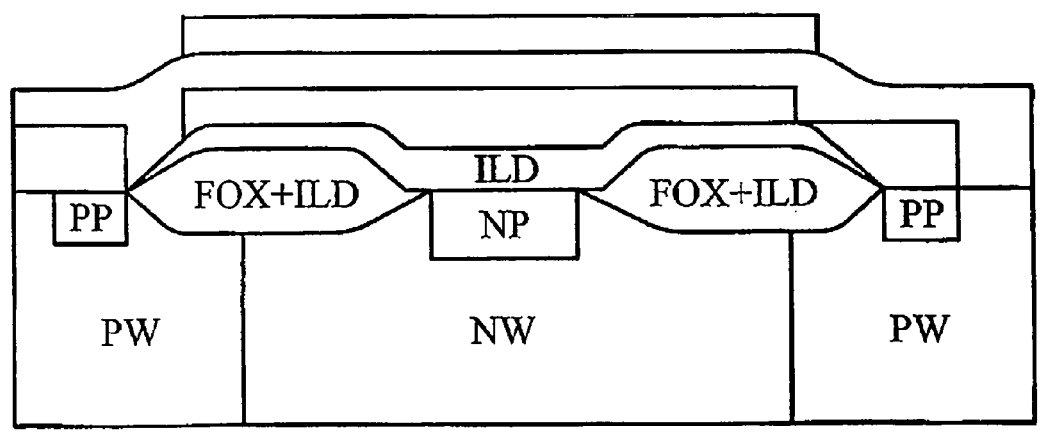
FIG. 2D is a cross section of a P-type metal field device in high voltage technology according to an embodiment of the invention.
Figure 3A:
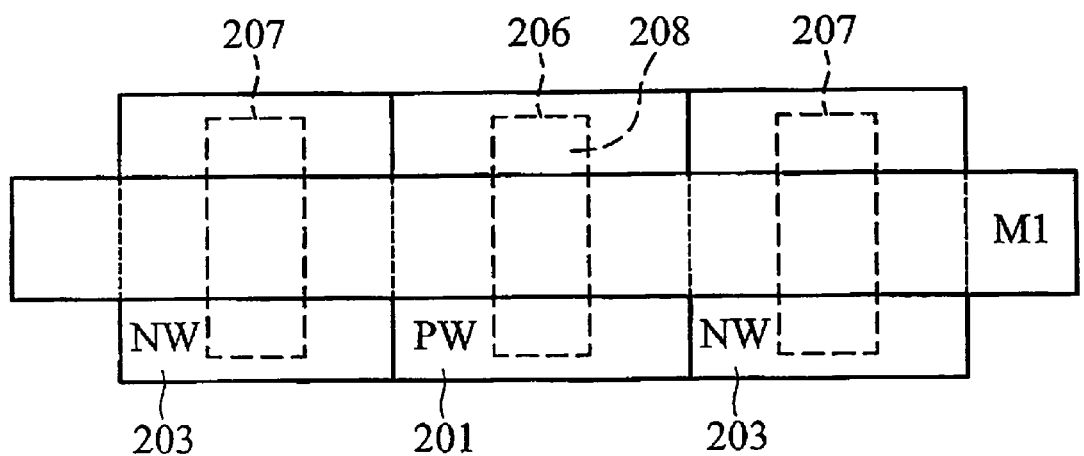
FIG. 3A shows a layout of the N-type metal field device show in FIG. 2C.
Figure 3B:
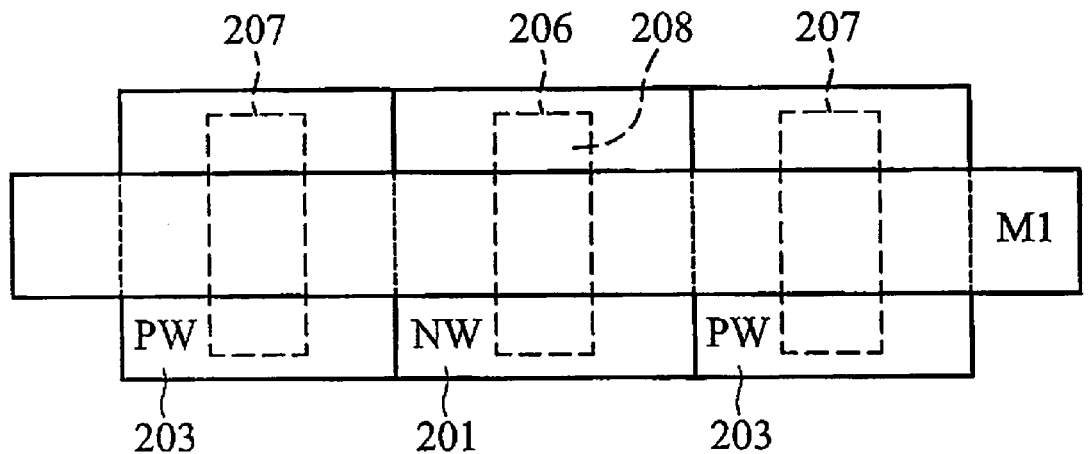
FIG. 3B shows a layout of the N-type metal field device show in FIG. 2D.

FIG. 3A shows a layout of the N-type metal field device shown in FIG. 2C and FIG. 3B a layout of the P-type metal field device shown in FIG. 2D. In FIG. 3A, the P-well 201 is disposed between the N-wells 203. Dashed-boxes in FIG. 3A define the isolation structure. The opening 206 is arranged for subsequent formation of the P-type heavily region 208. The N-type heavily doped regions 207 are respectively disposed in the N-wells 203. FIG. 3B differs from FIG. 3A in that the doping types thereof are opposite.

Experimental data shows that a conventional metal field device with a first metal layer M1 as a gate thereof has an electrical bias or threshold voltage of less than 15V. Even a conventional field device with an inter-metal dielectric (IMD) or a second dielectric layer and a second metal layer M2 (not shown in the figures) as a gate thereof over the first dielectric layer has an electrical bias or threshold voltage of less than 50V and suffers from abnormal turn-on. The metal field device according to an embodiment of the invention, however, has an electrical bias or threshold voltage exceeding about 15V with a first metal layer M1 as a gate thereof and preferably larger than about 30V. The metal field device according to an embodiment of the invention has an electrical bias or threshold voltage exceeding about 50V with a second metal layer M2 as a gate thereof.

Figure 4A:
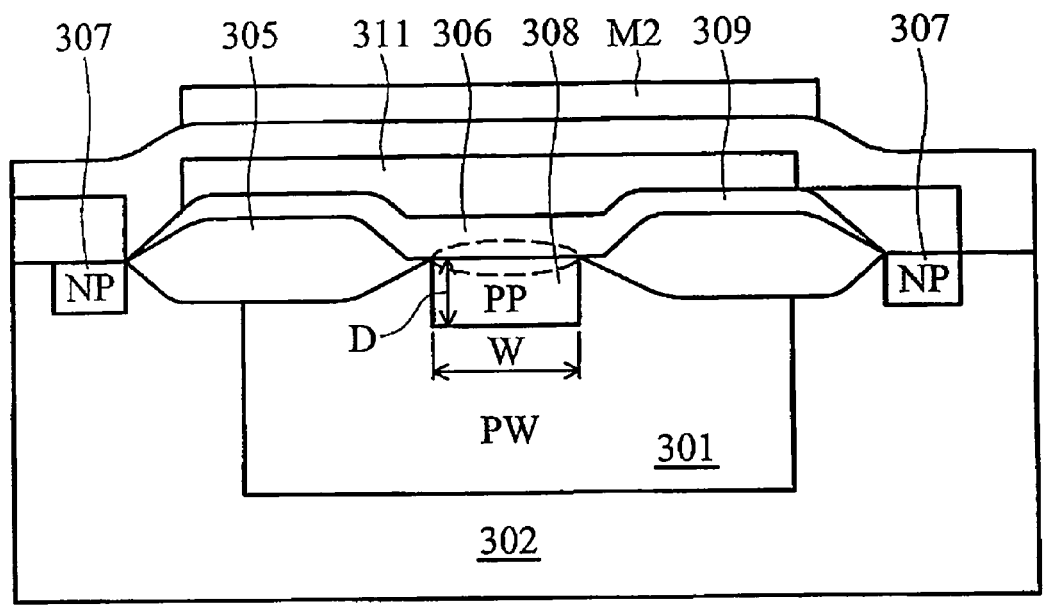
FIG. 4A is a cross section of an N-type metal field device in high voltage technology according to another embodiment of the invention.
Figure 4B:
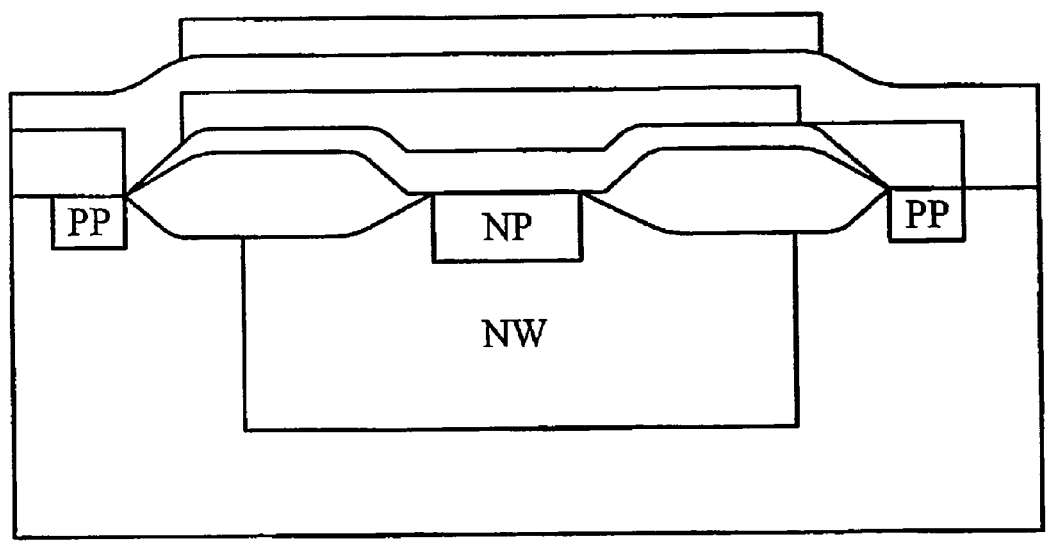
FIG. 4B is a cross section of a P-type metal field device in high voltage technology according to another embodiment of the invention.

FIG. 4A is a cross section of an isolation structure of an N-type metal field device in high voltage technology according to another embodiment of the invention. The metal field device comprises a N-type substrate 302, a P-well 301 having a surface doping concentration about $5*10^{11}$ to about $5*10^{12}$ atoms/cm$^2$ in the N-type substrate 302, an isolation region 305, two N-type heavily doped regions 307 having a surface doping concentration about $5*10^{14}$ to about $5*10^{15}$ atoms/cm$^2$, a P-type heavily doped region 308 having a surface doping concentration about $5*10^{14}$ to about $5*10^{15}$ atoms/cm$^2$, an interlevel dielectric (ILD) or the first dielectric layer 309, and a metal layer 311. The substrate 302 can be silicon, silicon-on insulator (SOI), and silicon-germanium (SiGe). The silicon thickness over insulator of SOI is larger than about 2 µm. The P-well 301 is disposed in the N-type substrate 302. The isolation region 305 has an opening 306 over the P-well 301 and overlays the N-type substrate 302 and the P-well 301. The N-type heavily doped regions 307 are respectively disposed on two sides of the P-well 301 and in the N-type substrate 302. The P-type heavily doped region 308 is disposed under and substantially surrounded by the opening 306 of the isolation region 305. Junction depth D of the P-type heavily doped region 308 is larger than about 0.2 µm. Width W of the P-type heavily doped region 308 is larger than about 0.5 µm. The interlevel dielectric (ILD) 309 overlays the isolation region 305 and the P-type heavily doped region 308. The metal layer 311 is disposed on the interlevel dielectric (ILD) 309. More specifically, the isolation region 305 is a local oxidation of silicon (LOCOS), shallow trench isolation (STI), and deep trench isolation (DTI) structure. Though an N-type metal field device is used as an example of the embodiment, the scope of the invention is not limited thereto. The invention also applies to a P-type metal field device with doping types thereof opposite to the N-type metal field device, as shown in FIG. 4B.

Figure 5A:
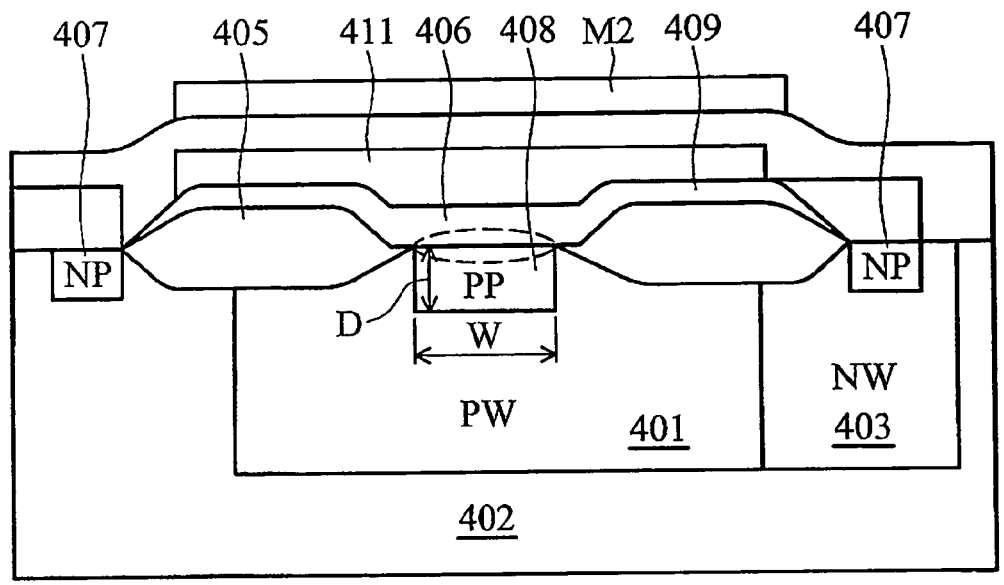
FIG. 5A is a cross section of an N-type metal field device in high voltage technology according to yet another embodiment of the invention.
Figure 5B:
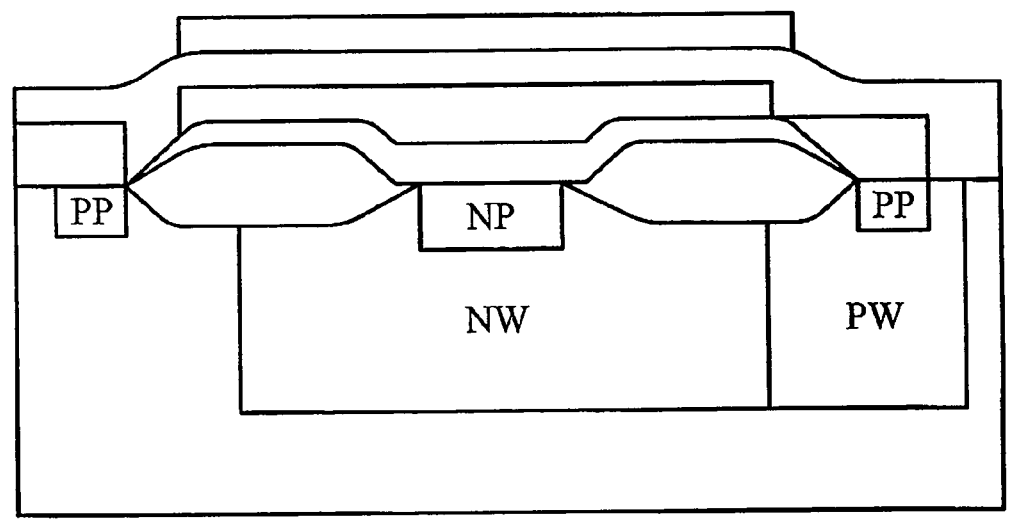
FIG. 5B is a cross section of a P-type metal field device in high voltage technology according to another embodiment of the invention.

FIG. 5A is a cross section of an isolation structure of an N-type metal field device in high voltage technology according to yet another embodiment of the invention. The metal field device comprises a N-type substrate 402, a P-well 401 having a surface doping concentration about $5*10^{11}$ to about $5*10^{12}$ atoms/cm$^2$, an N-well 403 having a surface doping concentration about $5*10^{11}$ to about $5*10^{12}$ atoms/cm$^2$, an isolation region 405, two N-type heavily doped regions 407 having a doping concentration about $5*10^{14}$ to about $5*10^{15}$ atoms/cm$^2$, a P-type heavily doped region 408 having a surface doping concentration about $5*10^{14}$ to about $5*10^{15}$ atoms/cm$^2$, an interlevel dielectric (ILD) or the first dielectric layer 409, and a metal layer 411. The substrate 402 can be silicon, silicon-on insulator (SOI), and silicon-germanium (SiGe). The silicon thickness over insulator of SOI is larger than about 2 µm. The P-well 401 is disposed in the N-type substrate 402. The N-well 403 is disposed adjacent to the P-well 401. The isolation region 405 has an opening 406 over the P-well 408 and overlays the substrate 402 and the wells 401 and 403. The N-type heavily doped regions 407 are respectively disposed in N-well 403 and the substrate 402. The P-type heavily doped region 408 is disposed under and substantially surrounded by the opening 406 of the isolation region 405. Junction depth D of the P-type heavily doped region 408 is larger than about 0.2 µm. Width W of the P-type heavily doped region 408 is larger than about 0.5 µm. The interlevel dielectric (ILD) 409 overlays the isolation region 405 and the P-type heavily doped region 408. The metal layer 411 is disposed on the interlevel dielectric (ILD) 409. More specifically, the isolation region 405 is a local oxidation of silicon (LOCOS), shallow trench isolation (STI), and deep trench isolation (DTI) structure. Though an N-type metal field device is taken as an example of the embodiment, the scope of the invention is not limited thereto. The invention also applies to a P-type metal field device with doping types thereof opposite to the N-type metal field device, as shown in FIG. 5B.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage device, comprising:
   a substrate;
   two heavily doped regions of a second conductivity type in the substrate;
   at least two isolation regions in the semiconductor substrate and between the two heavily doped regions;
   a heavily doped region of a first conductivity type disposed in the substrate and between the two isolation regions;
   a dielectric layer on the heavily doped region of the first conductivity type;
   a metal layer separated from the heavily doped region of a first conductivity type by the dielectric layer, wherein a portion of the metal layer overlies a portion of the dielectric layer overlying the heavily doped region of a first conductivity type, and at least a portion of the metal layer directly overlies the dielectric layer, the heavily doped region of the first conductivity type and the at least two isolation regions; and
   a diffusion region of the first conductivity type surrounding the heavily doped region of the first conductivity type and disposed between the heavily doped regions of the second conductivity type,
   wherein the metal layer is not electrically connected to the doped region of the first conductive type.

2. The high voltage device as claimed in claim 1, wherein the heavily doped region of the first conductivity type cuts turning-on current path below the two isolation regions from one of the two heavily doped regions to another one of the two heavily doped regions when a bias is applied to the high voltage device.

3. The high voltage device as claimed in claim 1, wherein each isolation region is a local oxidation of silicon (LOCOS).

4. The high voltage device as claimed in claim 1, wherein the surface concentration of the heavily doped region of the first conductivity type is about $5*10^{14}$ to about $5*10^{15}$ atoms/cm$^2$.

5. The high voltage device as claimed in claim 1, wherein each isolation region is a shallow trench isolation (STI).

6. The high voltage device as claimed in claim 1, wherein surfaces the two heavily doped regions of the second conductivity type and the heavily doped region of the first conductivity type are co-planar with the substrate surface.

7. The high voltage device as claimed in claim 1, wherein each isolation region is a deep trench isolation (DTI) structure.

8. The high voltage device as claimed in claim 1, wherein junction depth of the heavily doped region of the first conductivity type is larger than about 0.2 μm.

9. The high voltage device as claimed in claim 1, wherein width of the heavily doped region of the second conductivity type is larger than about 0.5 μm.

10. The high voltage device as claimed in claim 1, further comprising a first diffusion region of the second conductivity type surrounding one of the heavily doped regions of the second conductivity type.

11. The high voltage device as claimed in claim 10, further comprising a second diffusion region surrounding the other heavily doped region of the second conductivity type.

12. The high voltage as claimed in claim 1, wherein the high voltage device with the metal layer as a gate can be applied with an electrical bias higher than about 15V.

13. The high voltage device as claimed in claim 1, wherein the high voltage device with the metal layer as a gate can be applied with an electrical bias higher than about 30V.

14. The high voltage device as claimed in claim 1, wherein the high voltage device with the metal layer as a gate can be applied with an electrical bias exceeding about 50V.

* * * * *